United States Patent [19]
Senda

[11] Patent Number: 5,566,363
[45] Date of Patent: Oct. 15, 1996

[54] TRANSMISSION POWER CONTROL CIRCUIT AND MOBILE COMMUNICATION SYSTEM INCORPORATING THE CIRCUIT

[75] Inventor: Haruyasu Senda, Hyogo-ken, Japan

[73] Assignee: Mitsubishi Denki Kabushiki Kaisha, Tokyo, Japan

[21] Appl. No.: 408,848

[22] Filed: Mar. 23, 1995

[30] Foreign Application Priority Data

Jun. 15, 1994 [JP] Japan ................................. 6-133069

[51] Int. Cl.⁶ ........................................................ H04B 1/04
[52] U.S. Cl. ............................ 455/126; 455/115; 330/129
[58] Field of Search ............................ 330/279, 129, 330/138, 280; 455/126, 127, 115, 116

[56] References Cited

U.S. PATENT DOCUMENTS

| 3,969,683 | 7/1976 | Fabricius | 330/129 |
| 4,807,035 | 2/1989 | Sayliss | 330/129 |

FOREIGN PATENT DOCUMENTS

| 61-133713 | 6/1986 | Japan . |
| 61-173507 | 8/1986 | Japan . |

Primary Examiner—Reinhard J. Eisenzopf
Assistant Examiner—Nguyen Vo

Attorney, Agent, or Firm—Rothwell, Figg, Ernst & Kurz

[57] ABSTRACT

A transmission power control circuit for controlling a power level of a transmission signal is provided which comprises a variable attenuator (2) for adjusting the amplitude level of an input signal, a detection circuit for detecting an amplitude of the transmission signal via a branch circuit (5), a reference voltage source (7) for generating a reference voltage associated to a predetermined level of the transmission signal to be transmitted, a comparator (11) for comparing the reference and detection voltages, a clock generator (13), an up/down counter (12) for up or down counting pluses of a clock output from the clock generator, a D/A converter (14) for converting the count value of the counter, and a control circuit (10). The comparator subjects the counter to the up or down counting operation when the detection voltage is less or larger than the reference voltage to provide an attenuation control signal to the alternator through the D/A convertor so that attenuation level is adjusted, whereby the detection voltage substantially coincides with the reference voltage. The control circuit controls the reference voltage source to vary the level of said reference voltage in accordance with the transmission signal and controls the clock generator to generate the clock having a high frequency during a transition period of the reference voltage and a low frequency during the reference voltage being kept substantially constant, whereby change of the transmission power level can be executed at a relatively high speed without interference for the adjacent channels.

13 Claims, 12 Drawing Sheets

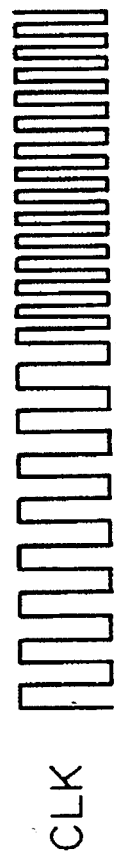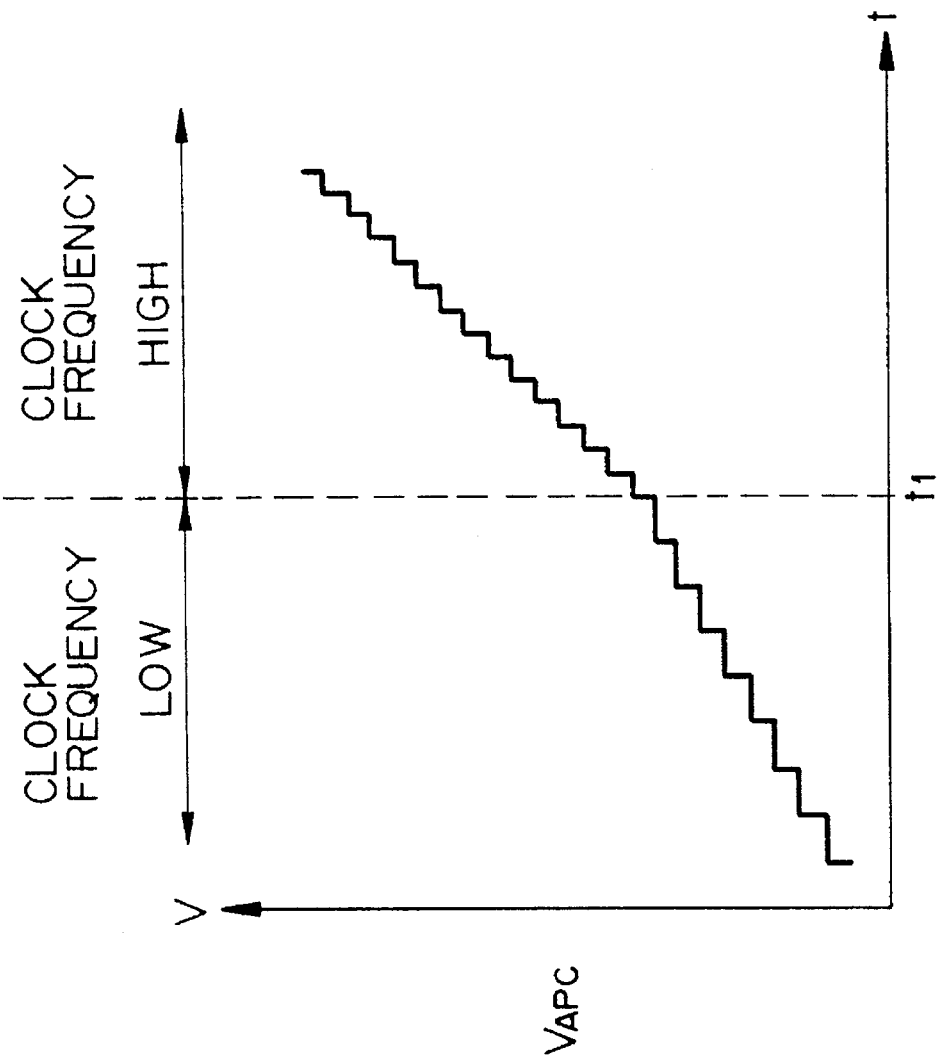
Fig. 6(A)
Fig. 6(B)

TRANSMISSION POWER CONTROL CIRCUIT AND MOBILE COMMUNICATION SYSTEM INCORPORATING THE CIRCUIT

BACKGROUND OF THE INVENTION

1. Field of the Invention

The present invention relates to a transmission power control apparatus, and more particularly, to an apparatus for controlling a power of a transmission signal, which is incorporated in a transmission section of a Time-Division Multiple Access (TDMA) radio transmission/reception apparatus of a base station or mobile station in a digital mobile communication system employing an amplitude modulation method.

2. Prior Art

FIG. 1 shows a conventional transmission power control apparatus. In FIG. 1, the reference numeral 1 denotes an input terminal to which a high-frequency input signal is provided, 2 a variable attenuator for attenuating the input signal in accordance with an attenuation control signal $V_{APC}$, 3 a power amplifier for amplifying a power or amplitude of a signal from in the attenuator 2, 5 an output terminal for outputting the attenuated and amplified signal as a power controlled transmission signal, and 5 a branch circuit for branching a part of the attenuated and amplified signal.

The reference numeral 6 denotes a detection circuit for detecting a direct current (DC) level of a signal branched by the branch circuit 5 to produce a detection voltage $V_{DET}$ which is proportional to the level of the transmission signal. The numeral 7 denotes a reference voltage source for providing a reference voltage $V_{REF}$, 8 an error amplifier for comparing the detection voltage $V_{DET}$ with the reference voltage $V_{REF}$ to generate an error voltage $V_{ERR}$ corresponding to the difference between the detection and reference voltages $V_{DET}$ and $V_{REF}$, and 9 a time constant circuit for controlling a time constant for the error voltage $V_{ERR}$ to provide a voltage as the attenuation control signal $V_{APC}$ to be supplied to the attenuator 2. The reference numeral 10 denotes a control circuit for controlling the reference voltage source 7 and time constant circuit 9 to vary the values of the reference voltage $V_{REF}$ and time constant by providing reference voltage and time constant control signals $S_{10-7}$ and $S_{10-9}$ thereto, respectively.

in the prior transmission power control circuit shown in FIG. 1, the reference voltage $V_{REF}$ output from the reference voltage source 7 is used to set the power level of the transmission signal. That is, the high-frequency input signal is attenuated and amplified through the attenuator 2 and the amplifier 3 and then is output from the output terminal 4, while it is branched by the branch circuit 4 and then is converted into the DC detection voltage $V_{DET}$ at the detection circuit 6. The detection voltage $V_{DET}$ is compared with the reference voltage $V_{REF}$ by the error amplifier 8 to create the error voltage $V_{ERR}$. The error voltage $V_{ERR}$ is supplied as the attenuation control signal $V_{APC}$ via the time constant circuit 9 to the variable attenuator 2 to adjust the attenuation amount of the signal such that the detection voltage $V_{DET}$ becomes the same as the reference voltage $V_{REF}$. Accordingly, the transmission signal from the output terminal 4 will be set to have a predetermined power level determined by the reference voltage $V_{REF}$.

In the prior art, in order to perform transmission power control with high accuracy, such a feedback control as described above is needed. However, in handling a signal with an amplitude variation, or an amplitude modulated signal, a time constant of the feedback control has to be increased to such an extent that it does not respond to the amplitude information of the modulated signal, thereby the amplitude factor of the modulated signal is not suppressed by the feedback control. A transmission signal subjected by a π/4DQPSK modulation can be taken as an example signal with the amplitude information.

On the other hand, when the reference voltage $V_{REF}$ should be changed by the control circuit 10, the feedback loop have to follow the change of the reference voltage $V_{REF}$ without a substantial delay. To cope with this, the time constant is required to be made smaller. This necessity exists irrespective of types of modulation and/or transmission, and/or whether the transmission power control circuit is incorporated in a base station or in a mobile station of a mobile communication system.

Therefore, opposite requirements exist in the feedback control of the transmission power control circuit.

Taking as an example, a transmission power control circuit in a transmission section of a TDMA radio transmission/reception in a base station, the above-mentioned problems will be described in detail by reference to FIGS. 2(A)–2(C), 3, and 4(A), 4(B).

FIG. 2(A) shows a waveform of the reference voltage $V_{REF}$ applied from the reference voltage source 7 to the error amplifier 8. The voltage $V_{REF}$ is varied in accordance with the control signal $S_{10-7}$ provided from the control circuit 10 as shown in FIG. 2(B). FIG. 2(C) illustrates a waveform of the attenuation control voltage $V_{APC}$ provided from the time constant circuit 9 to the variable attenuator 2. In FIG. 2(B), the logical high and low levels of the control signal $S_{10-7}$ correspond to the time constant to be lowered and heightened, respectively.

FIG. 3 is a diagram showing a first spectrum $SP_1$ in a case where transmission power levels are different for respective slots and a second spectrum $SP_2$ in a case where they are the same for all the slots. FIGS. 4(A) and 4(B) show conventional detailed circuit diagrams of the time constant circuits 9, where the circuits utilize an analog switch SW and diodes $D_1$ and $D_2$, respectively to change the time constant.

In particular, the transmission section of the TDMA radio transmission/reception apparatus installed in the base station is generally constituted such that different output powers can be set for individual transmission slots because distances therefrom to respective mobile stations within a radio zone are not substantially constant. Due to this condition, it is needed to set the reference voltage $V_{REF}$ for the individual transmission slots. Further in the base station, since errors in the transmission power levels lead to errors in a service area, high accuracy of the power levels is required. Moreover, by such a power level control as described above, neither an amplitude modulated signal in a current channel or slot nor channels adjacent to the current slots must be affected.

To this end, when the slots are changed, it is required that a transmission power level of the next slot is quickly and accurately attained and that the adjacent channels are prevented from being interfered with expansion of the transmission wave spectrum of the transmitter. Accordingly, the time constant of the feedback control needs to be made so small that it is followed at a high speed to the reference voltage $V_{REF}$ which smoothly varies as shown in FIG. 2(A). With a view to satisfying these two contradictory requirements, there is provided a method in which, as shown in FIG. 2(B), the time constant is switched to small only during a power control time period, or during the time constant control signal $S_{10\text{-}9}$ is high, when the slots are to be changed.

As one means for realizing the above method, a serial connection of the analog switch SW and a resistor R1 is connected in parallel with a resistor R2 as shown in FIG. 4(A). The switch SW is turned on only when the control signal $S_{10\text{-}9}$ is high as shown in FIG. 3(B) in order to reduce the time constant at the time constant circuit 9. In this case, however, there are drawbacks that high-frequency factors at the front and back edges of pulses included in the control signal $S_{10\text{,}7}$ leak through an internal capacity of the analog switch SW to the attenuation control voltage $V_{APC}$, and this ends up generating noise as shown in FIG. 2(C), whereby adjacent channels are affected as shown in FIG. 3.

Another means for realizing the above method of changing the time constant is shown in FIG. 3(B), in which diodes $D_1$ and $D_2$ are used instead of the analog switch SW to switch the time constant. In this case, however, unless there is generated a voltage greater than a forward drop voltage (in the case of a Shottky barrier diode, about 0.1 V), the diodes cannot be turned on, and therefore this requires a certain device for turning on/off the diodes. Thus, there is a difficulty in controlling transmission power levels for individual slots.

SUMMARY OF THE INVENTION

The present invention has been made to solve the above problems, and an object thereof is to provide a transmission power control circuit having a relatively simple circuit configuration and capable of solving the problems in the prior arts.

In order to achieve the object of the present invention, a transmission power control circuit for adjusting a power level of a transmission signal to be output at a predetermined level according to the present invention comprising:

amplitude adjusting means in response to an amplitude control signal for adjusting an amplitude of an input signal to output the amplitude adjusted signal as said transmission signal;

detection means for detecting a DC level of said output signal to generate a detection voltage signal;

reference generating means for variably generating a reference voltage signal;

comparison means for comparing said detection voltage signal with said reference voltage signal to generate a logical signal representing whichever is larger, either the detection or reference voltage signal;

clock generating means for variably generating a clock signal;

amplitude control signal generating means including an up/down counter for up-counting or down-counting pulses of said clock signal in response to said logical signal output from said comparison means, and for generating said amplitude control signal associated with the count value of said up/down counter to said amplitude adjusting means; and control means for controlling said reference generating means to vary the level of said reference voltage signal according to said predetermined level of said transmission signal to be output, and for controlling said clock generating means to generate said clock signal having a high frequency during a transition period of the reference voltage signal and a low frequency during the reference voltage signal being kept substantially constant.

According to a preferred embodiment of the present invention, the amplitude adjusting means comprises a variable attenuator the attenuation amount at which is controlled in response to the amplitude control signal, or a combination of the attenuator and an amplifier for amplifying the attenuated signal, and the amplitude control signal generating means includes a D/A convertor for converting the count value of the up/down counter to an analog value to provide it as the amplitude control signal.

According to another preferred embodiment of the present invention, the up/down counter comprises a presettable up/down counter and the amplitude control signal generating means includes a memory storing initial values and for providing one of them corresponding to the transmission signal to the presettable up/down counter under a control of the control means to start the counting from the provided initial value.

According to further preferred embodiment of the present invention, the reference voltage signal output from the reference voltage generating means has a reference voltage range including a permissible ranges, and the comparison means comprises a window comparator to generate an inhibit signal to the up/down counter when the detection voltage signal exists within the reference voltage range to inhibit the up/down counter from the counting operation.

According to a preferred embodiment, the input signal comprises a plurality of amplitude modulated frame signals to the transmitted by a time-division multiplex transmission, and the control means controls the reference voltage generating means to vary the reference voltage signal in accordance with the frame signals.

The present invention can be applied to transmitter(s) of a base station and/or mobile stations in a mobile communication system employing an amplitude modulation method.

BRIEF DESCRIPTION OF THE DRAWINGS

FIGS. 6(A), 6(B) and 7(A)–7(D) show timing charts for explaining an operation of the first embodiment shown in FIG. 5 wherein a clock generator generates two different frequency clocks under a control of a control circuit;

DESCRIPTION OF PREFERRED EMBODIMENTS

Figure 1:
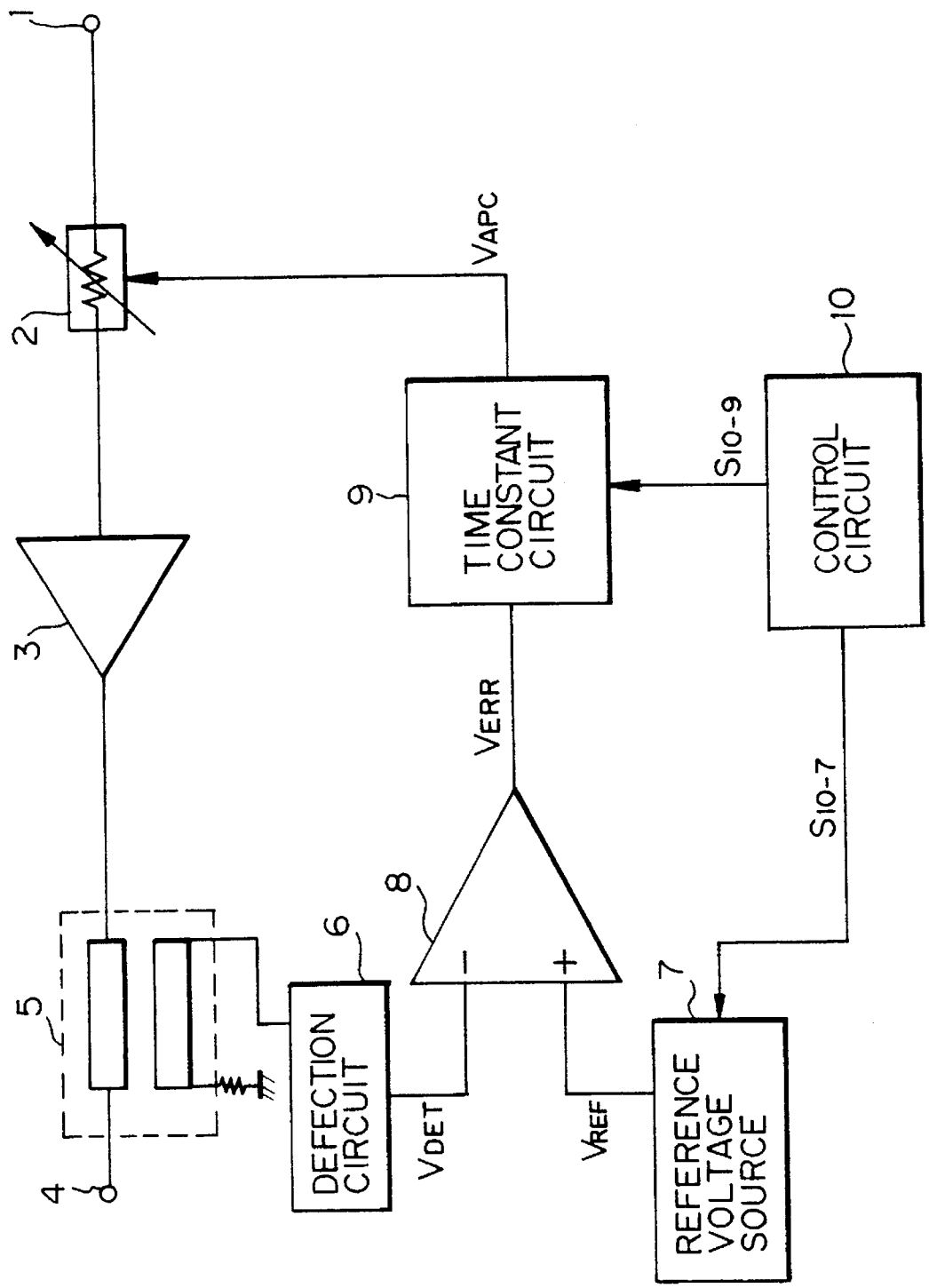
FIG. 1 is a circuit block diagram of a conventional transmission power control circuit.
Figure 2A:
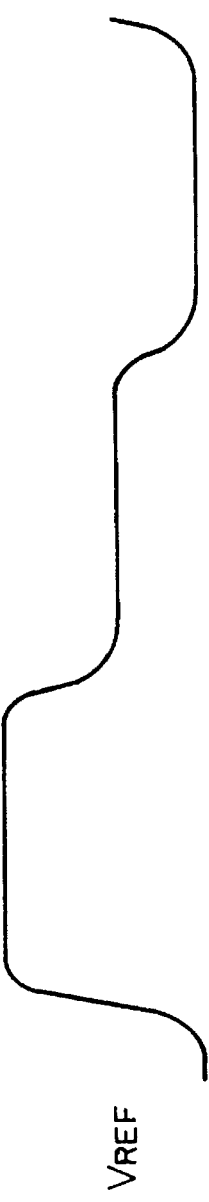
FIGS. 2(A)–2(C) show waveforms of signals in the conventional transmission power control circuit shown in FIG. 1.
Figure 2B:
Figure 2C:
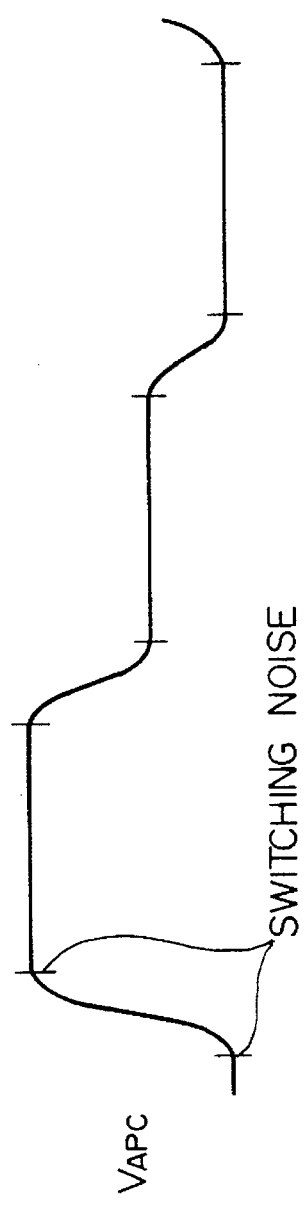
Figure 3:
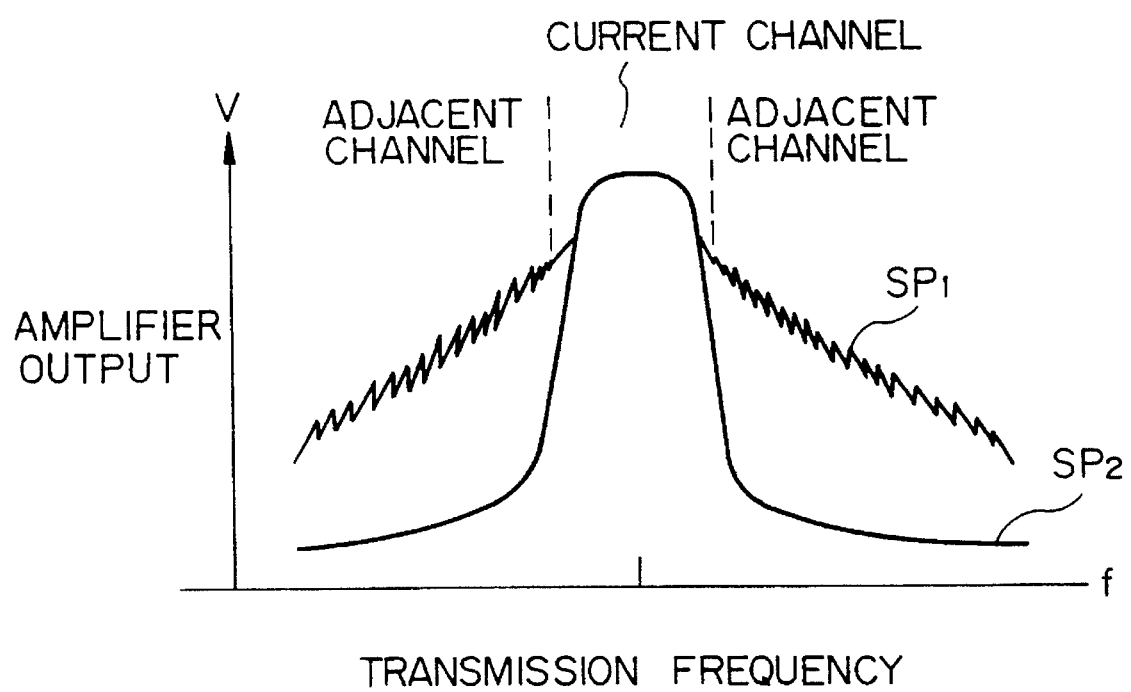
FIG. 3 shows graph for explaining how adjacent channels are affected by a current transmission channel.
Figure 4A:
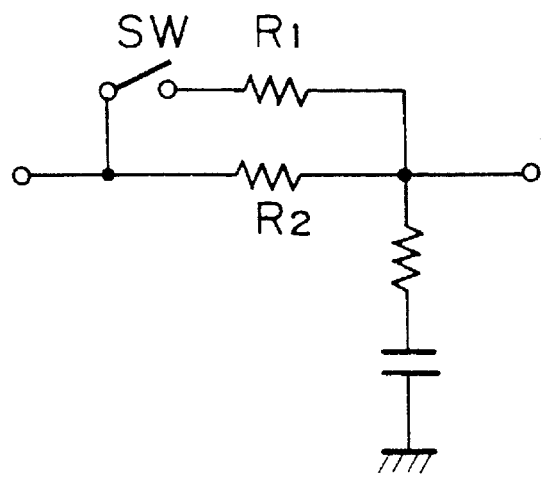
FIGS. 4(A) and 4(B) are two example circuit diagrams of a conventional time constant circuit incorporated in the prior art shown in FIG. 1.
Figure 4B:
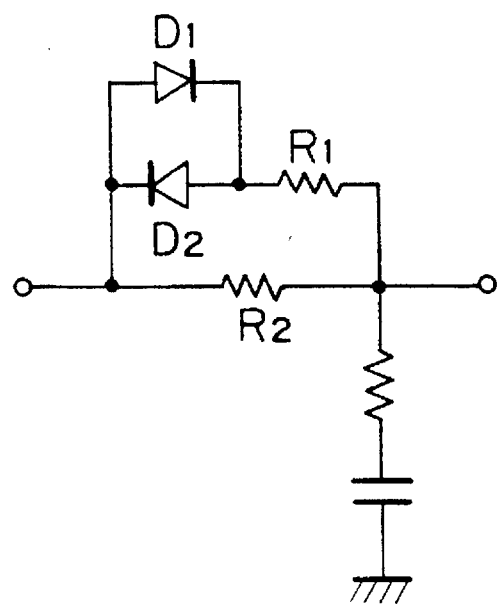
Figure 5:
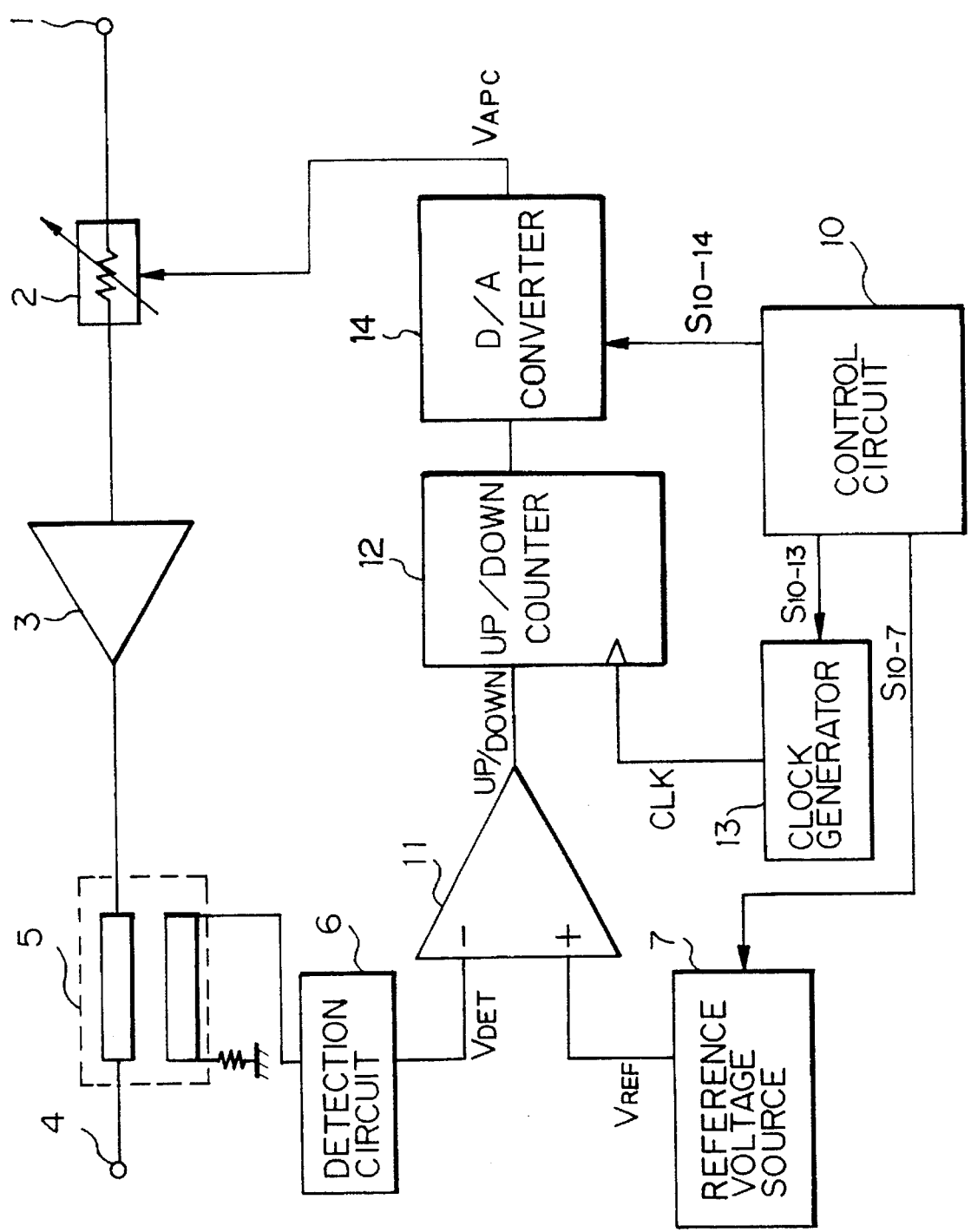
FIG. 5 is a circuit block diagram of a first embodiment of the present invention.

FIG. 5 shows a block diagram of an embodied transmission power control circuit of the present invention. In FIG. 5, the same reference numerals and symbols as in FIG. 1 denote the similar or identical components and signals of the prior art shown therein. The embodiment includes a comparator 11 which compares the detection and reference voltages $V_{DET}$ and $V_{REF}$ to generate an output having logical high and low levels according to the comparison, and an up/down counter 12 which up/down-counts pulses of a clock CLK generated from a clock generator 13 in accordance with the output of the comparator 11. The embodiment also comprises a D/A converter 14 which converts a digital count value from the up/down counter 12 to an analog value and supplies it as the attenuation control voltage $V_{APC}$ to the variable attenuator 2. A frequency of the clock CLK is variable in response to a clock control signal $S_{10-13}$ provided from the control circuit 10.

More detailed constitution of the embodiment will be clear by referring to an operation thereof described below.

A high-frequency input signal provided at the input terminal 1 is attenuated by the variable attenuator 2 and then is amplified by the power amplifier 3. The attenuated and amplified signal is output via the branch circuit 5 from the output terminal 4 as a power controlled transmission signal. The attenuated and amplified signal is also caused to branch off by the branch circuit 5, and thereafter a DC voltage thereof is detected at the detection circuit 6 to create the detection voltage $V_{DET}$. The detection voltage $V_{DET}$ is input to one of input terminals of the comparator 11 where it is compared with the reference voltage $V_{REF}$ supplied to the other input terminal thereof from the reference voltage source 7. When the detection voltage $V_{DET}$ is lower than the reference voltage $V_{REF}$, the comparator 11 generates a logical high level of 5 V, for instance, otherwise it generates a logical low level of 0 V, for instance.

The output of the comparator 11 is supplied to an up/down control terminal of the up/down counter 12. The counter 12 is constituted to up-count when the output of the comparator 11 is the high level and down-count when it is the low level. Accordingly, the counter 12 up-counts the pluses of the clock CLK generated from the clock generator 13 when the reference voltage $V_{REF}$ is higher than the detection voltage $V_{DET}$, while down-counts them when the former is lower than the latter. The count value at the up-down counter 12 is converted to an analog signal by the D/A converter 14 and is then provided as the attenuation control signal $V_{APC}$ to the variable attenuator 2.

The comparator 11, up/down counter 12 and D/A convertor 14 perform an operation of comparing and making coincident between the reference and detection voltages $V_{REF}$ and $V_{DET}$ synchronously with the clock CLK, and the attenuation control signal $V_{APC}$ from the D/A converter 14 is changed to adjust the amount of the attenuation at the variable attenuator 2 such that the voltage $V_{DET}$ from the detection circuit 6 becomes identical to the voltage $V_{REF}$ from the reference voltage source 7.

When trying to increase the response speed, in other words, when trying to make the time constant smaller, the control circuit 10 provides the clock control signal $S_{10-13}$ to the clock generator 13 to vary the frequency of the clock CLK higher. This operation will be described by referring to FIGS. 6(A) and 6(B). FIG. 6(A) shows the clock CLK generated from the clock generator 11, wherein the clock frequency is initially set low, but it is then changed higher than the initial frequency at a time $t=t_1$. FIG. 6(B) illustrates the output or attenuation voltage $V_{APC}$ from the D/A convertor 14. As apparent from FIGS. 6(A) and 6(B), the inclination of the voltage $V_{APC}$ gets steeper as the clock frequency becomes larger. The example shown in FIG. 6(B) describes a case in which the up/down counter is up-counting in response to the output from the comparator 11 being high. It is a matter of course that when the output from the comparator 11 is low, the voltage $V_{APC}$ has a negative inclination.

In other words, when the frequency of the clock CLK is set higher, the number of times of comparing between the voltages $V_{REF}$ and $V_{DET}$ within a certain time period is increased in proportion to the frequency of the clock CLK, and thus the upward or downward inclination of the voltage $V_{APC}$ from the D/A converter 14 gets steeper. Namely, the time constant gets smaller. In contrast, when trying to increase the time constant, the clock frequency should be lowered.

FIGS. 7(A)–7(D) are diagrams of waveforms in the embodied transmission power control circuit shown in FIG. 5, respectively showing waveforms of the reference voltage $V_{REF}$ from the reference voltage source 7, the clock control signal $S_{10-13}$ from the control circuit 10, the clock CLK from the clock generator 13, and the output signal OUT from the output terminal 4 similar to the outputs of the attenuator 2 and power amplifier 3.

Figures 7A, 7B, 7C, 7D:
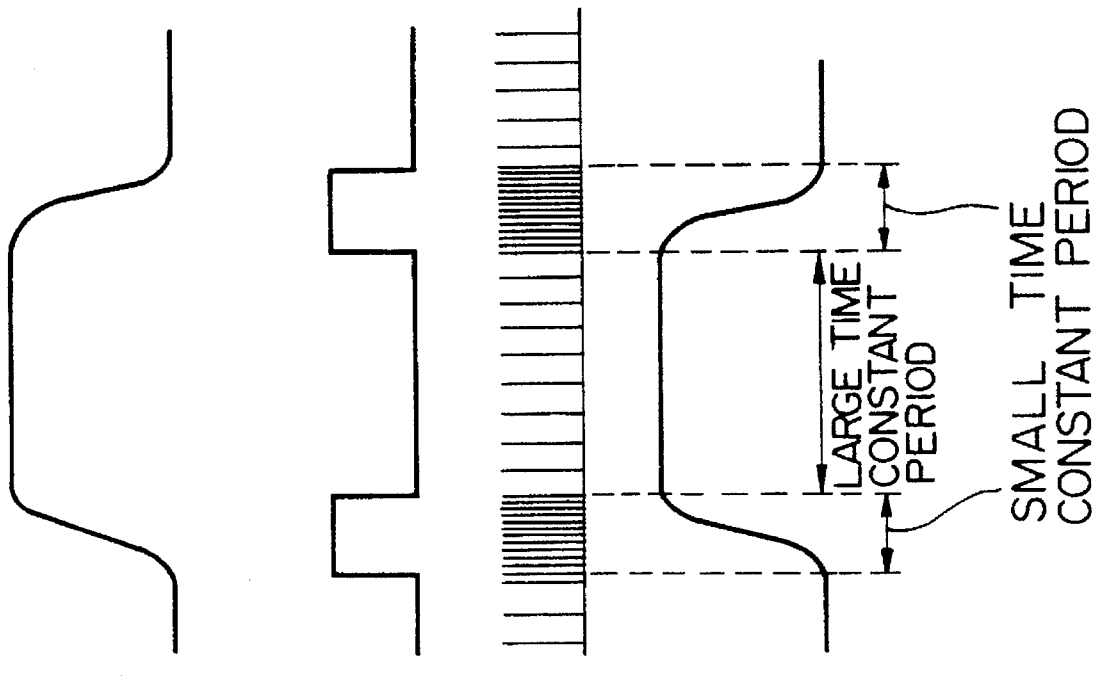

The reference voltage $V_{REF}$ is controlled by the voltage control signal $S_{10-7}$ from the control circuit 10 so that rising and falling edges thereof are smoothly varied as shown in FIG. 7(A). In order to follow the change in the reference voltage $V_{REF}$ at high speed, that is to make small a time constant of the power control feedback loop, the level of the clock control signal $S_{10-13}$ is made high only during a transition time periods of the reference voltage $V_{REF}$, as shown in FIG. 7(B). Based on the changes in the clock control signal $S_{10-13}$, the clock generator 13 generates the clock CLK having a high frequency only during the transition time periods of the reference voltage $V_{REF}$, while it outputs the clock having a low frequency during the other periods of time, as shown in FIG. 7(C).

During the clock frequency is high or small time constant period, since the number of times of the adjustment between the reference and detection voltages $V_{REF}$ and $V_{DEC}$ is increased, the level of the output signal OUT is stepwisely corrected at high speed to correspond to the reference voltage $V_{REF}$ having the waveform as shown in FIG. 7(A), and thus the waveforms of the rising and falling edges of the output signal OUT can follow those of the reference voltage at high speed, as shown in FIG. 7(D). On the other hand, during the clock frequency is low or large time constant period, since the number of times of the adjustment therebetween is decreased, the transmission power correction speed is low.

Since the output signal OUT is generally transmitted during the reference voltage $V_{REF}$ is kept constant, adjusting the transmission power level during the constant reference voltage period or transmission time period may result in distortion of the transmitted output signal, and therefore this is not preferable. However, it is possible to reduce the risk for the output signal by setting the clock frequency relatively low during the transmission time period.

In the operation of the transmission power control circuit described above, under the control of the control circuit 10, the clock generator 13 generates the clock CLK having two different frequencies as shown in FIG. 7(C). However, it is possible for the clock frequency in the transmission time period to be zero.

In this case, the waveforms of the reference voltage $V_{REF}$, clock control signal $S_{10-13}$, clock CLK, and output signal OUT are represented as shown in FIGS. 8(A)–8(D). Since during the transmission time period, the transmission power control is never executed and thus the transmission power is kept at a value controlled at the end of the power control time period, it is possible to eliminate a risk of the modulated waveform being affected during the transmission time period, thereby being particularly effective for a transmitter using an amplitude-modulation.

Figure 9:
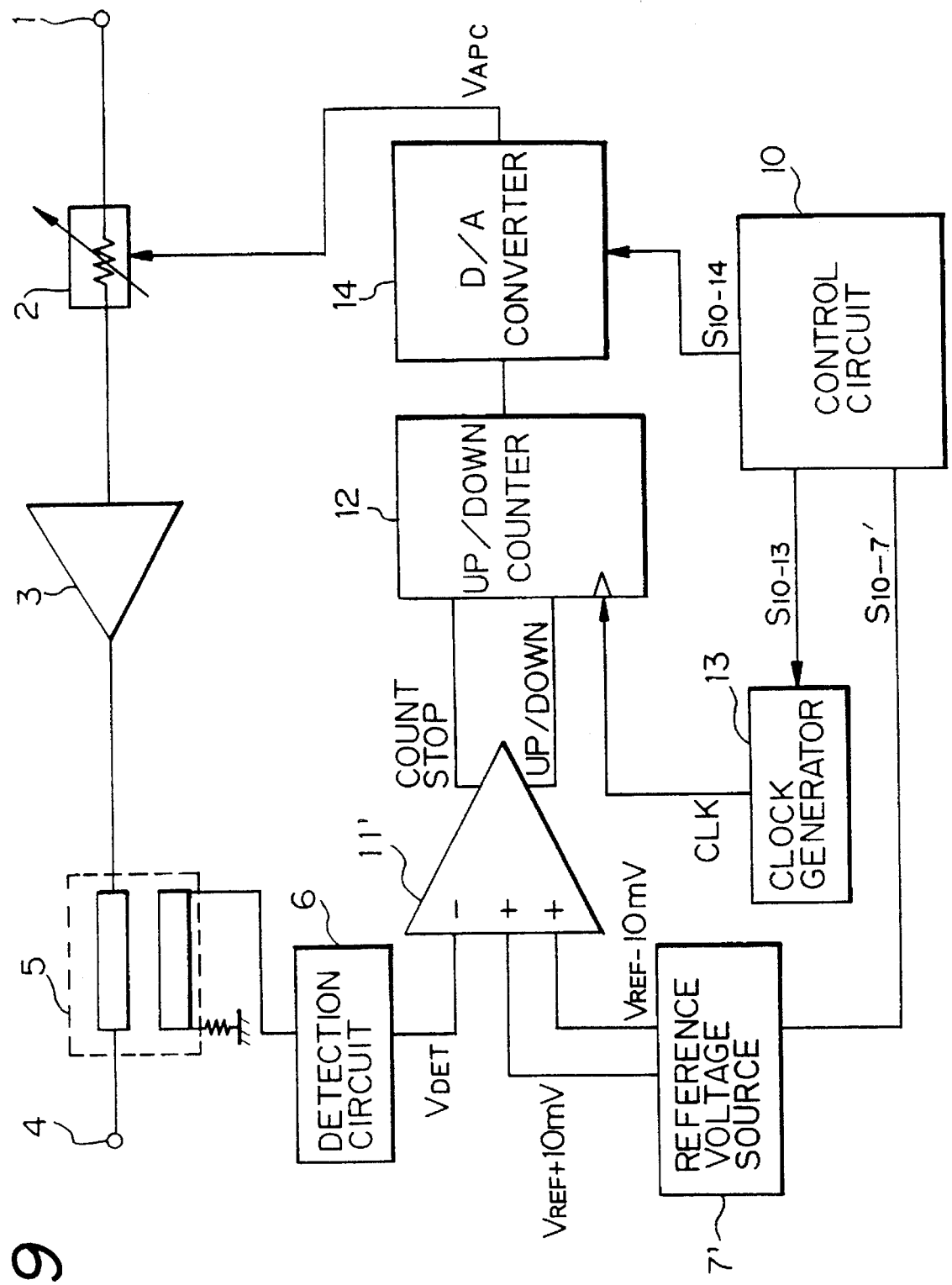
FIG. 9 is a circuit block diagram of a second embodiment of the present invention.

FIG. 9 shows a second embodiment of the present invention. In FIG. 9, components imparted the same reference numerals and symbols as those in FIG. 5 denote the same components and signals as those in the first embodiment. In the second embodiment, the comparator 11 of the first embodiment is replaced with a window comparator 11', and the reference voltage generator 7 of the first embodiment is constituted as a voltage generator 7' to generate two voltages of $V_{REF}+\alpha$ and $V_{REF}-\alpha$. The $\alpha$ is a permissible error voltage having 10 mV for instance of the transmission power. The value of $\alpha$ is not limited to 10 mV, but may be suitably selected in accordance with the range of an allowable error in a mobile communication system. The window comparator 11' provides a count stop signal $S_{11}'$ to the up/down counter 12 when the detection voltage $V_{DET}$ falls within the range of $V_{REF}\pm\alpha$.

Figure 10A:
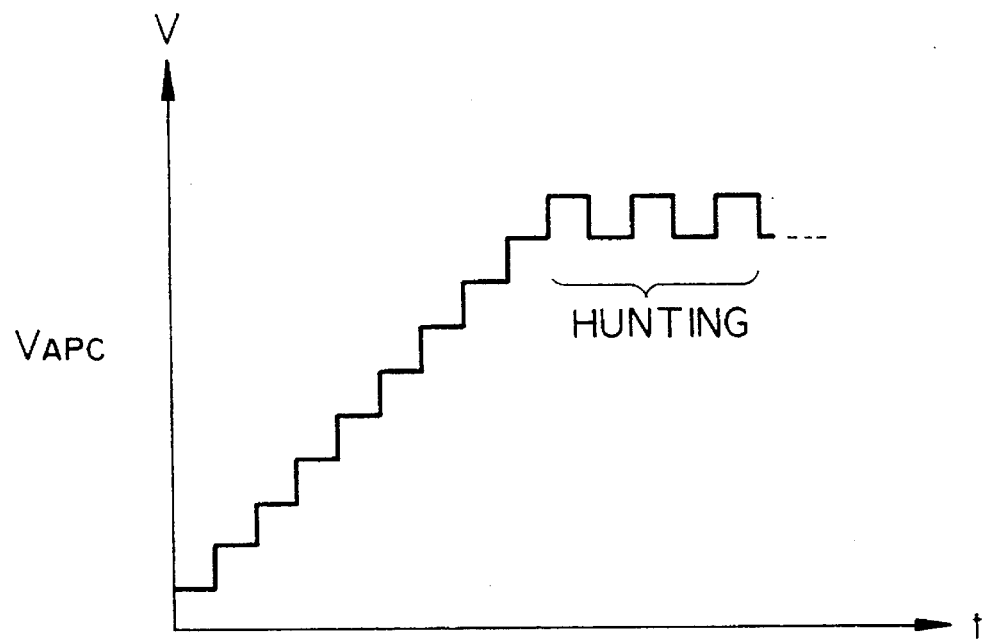
FIGS. 10(A) and 10(B) show timing charts each illustrating an output of a D/A convertor incorporated in the second embodiment shown in FIG. 9.
Figure 10B:
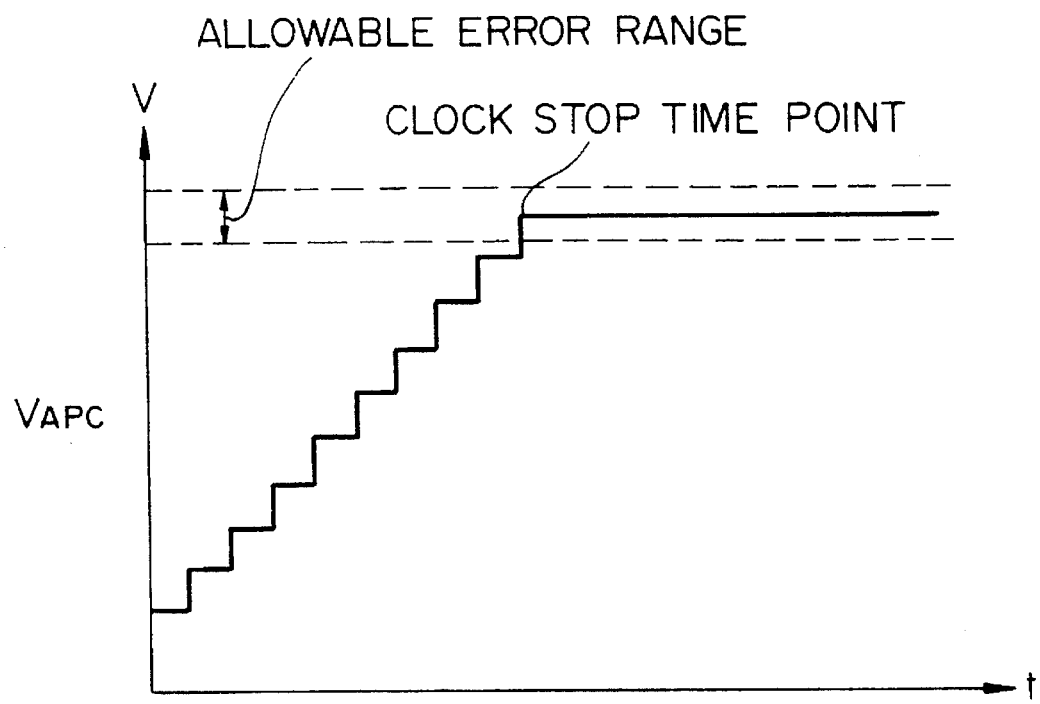

FIG. 10(A) illustrates the attenuation control voltage $V_{APC}$ or output of the D/A convertor 14 in the first embodiment provided that the clock generator 13 generates the clock having the same frequency, while FIG. 10(B) shows the voltage $V_{APC}$ in the second embodiment. As shown in FIG. 10(A), in a case that two kinds of power control, up and down, are employed, even after the transmission power has been substantially converged to a set value, the transmission power has unnecessary vibrations (hunting) in the vicinity of the set value, and hence it is not stable.

Figures 8A, 8B, 8C, 8D:
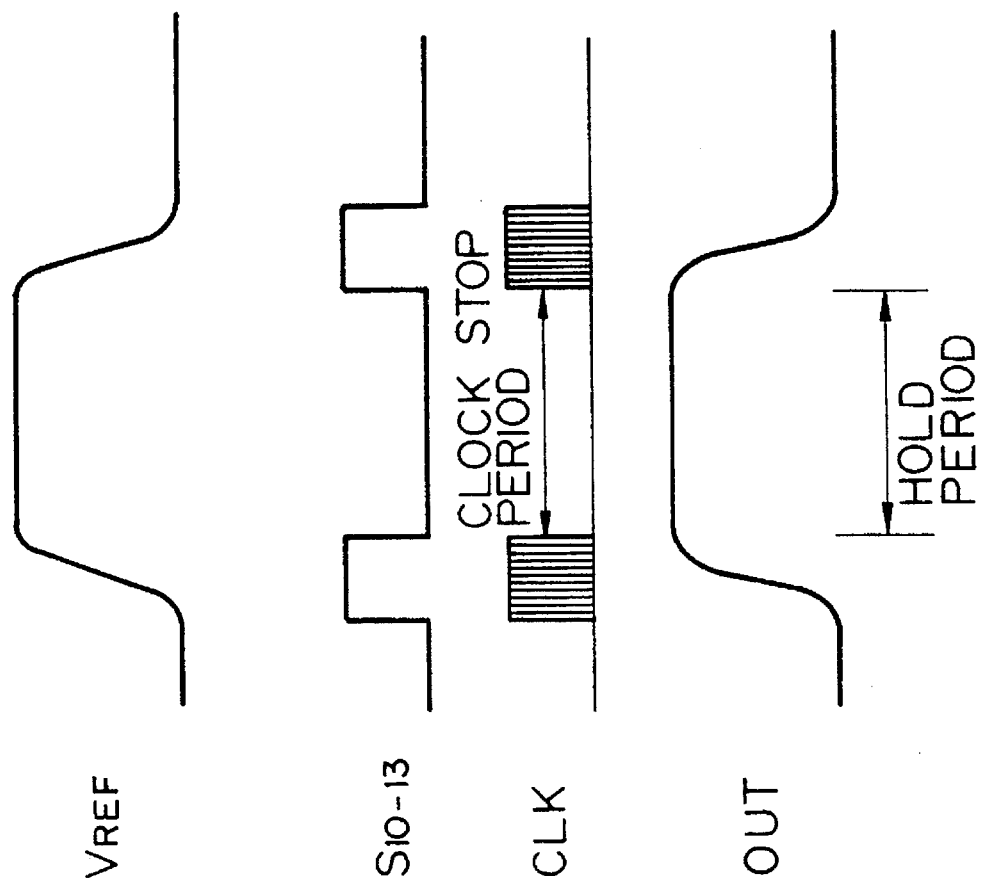
FIGS. 8(A)–8(D) show timing charts for explaining an operation of the first embodiment shown in FIG. 5 wherein a clock generator intermittently generates a clock under control of the control circuit.

This influence of the operation to a modulated signal is suppressed by reducing the number of times of adjustment or by setting it at zero during the transmission time period in the first embodiment, as shown in FIGS. 7(C) and 8(C). In contrast, in the second embodiment, as shown in FIG. 10(B), since it is constructed such that the counting operation is stopped when the detection voltage $V_{DET}$ exists within the range including an allowable error, it is possible to completely suppress an unnecessary factor for the transmission signal.

In the second embodiment, it is characterized that the comparison means for comparing the detection voltage $V_{DET}$ with the reference voltage $V_{REF}$ is constituted by the window comparator 11', and thus the clock frequency is not needed to be changed between the power control and transmission time periods. Of course, such a clock including two frequencies as that in the first embodiment is usable in the second embodiment.

Figure 11:
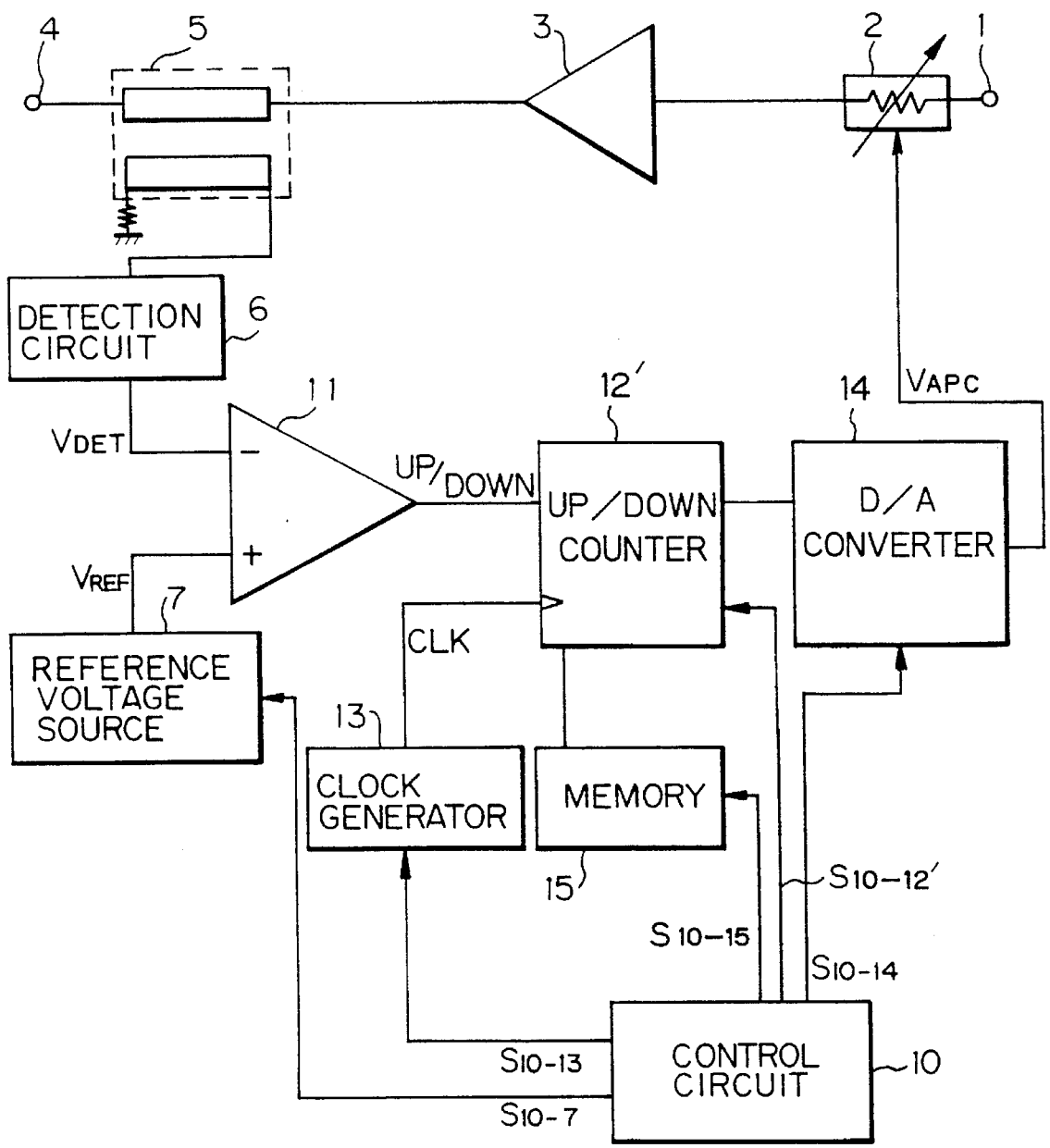
FIG. 11 is a circuit block diagram of a third embodiment of the present invention.

Referring to FIG. 11, a third embodiment will next be explained. In FIG. 11, components and signals indicated by the same reference numerals and symbols as those in FIG. 5 are identical to those in the first embodiment. The third embodiment includes a presettable up-down counter 12' for counting the clock from the clock generator 13, and a memory 15 for storing initial values and providing one of them to the counter 12' under control of the control circuit 10. The control circuit 10 provides an address signal $S_{10-15}$ to the memory 15 to read out one of the initial values corresponding to a current slot, and a load signal to the counter 12', whereby the read initial value is loaded into the counter 12'.

An operation of the third embodiment is similar to that of the first embodiment. However, in the third embodiment, since the initial value so loaded at the counter 12' is transmitted to the variable attenuator 2 via the D/A converter 14 at the beginning of the power control time period, and thus the operation can be started with the preset initial value, a time period required until the transmission level or detection voltage $V_{DET}$ is converged to the reference voltage $V_{REF}$ can be made shorter.

Figure 12:
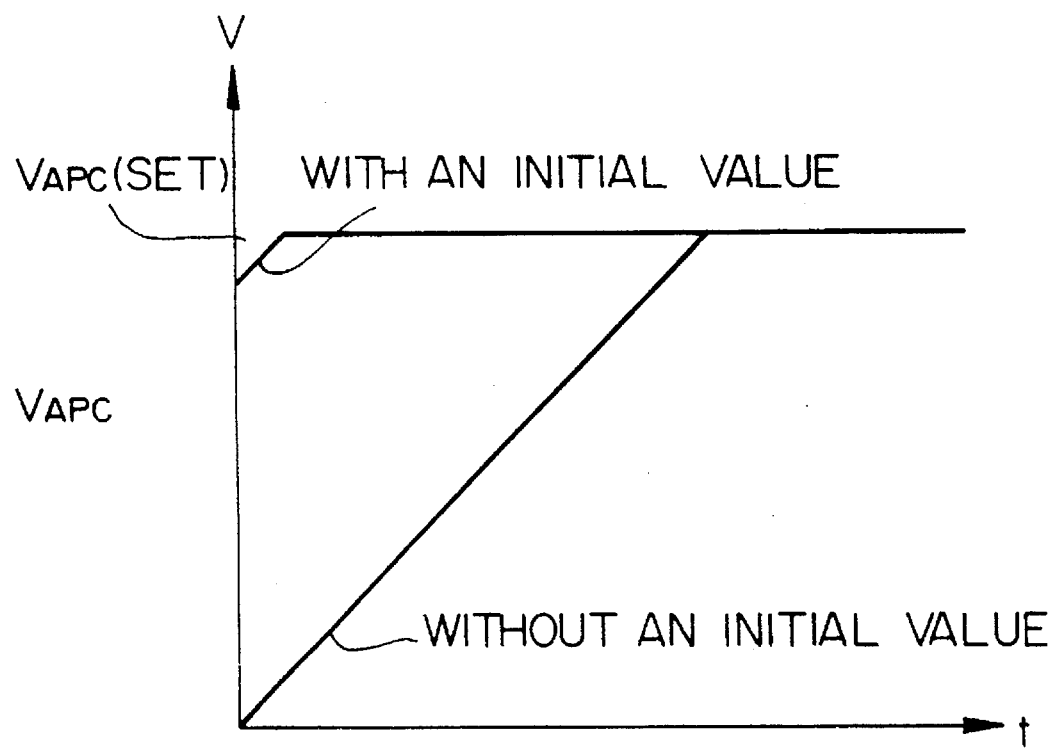
FIG. 12 is a timing chart showing an output of a D/A convertor incorporated in the third embodiment shown in FIG. 11.

This advantage will be made clear by referring to FIG. 12 showing waveforms of the attenuation control voltages from the D/A convertor 14 in two cases where no initial value has been preset in the counter as in the first embodiment and a proper initial value has been preset therein as in the third embodiment, respectively. As apparent from FIG. 12, the time period required until the attenuation control voltage $V_{APC}$ is converged to a set voltage $V_{APC(SET)}$ corresponding to the reference voltage $V_{REF}$ in the latter case is shorter than that in the former case. Accordingly, when the third embodiment is applied in a base station of a time-division multiplex communication system, the initial value is preset for each slot under the control of the control circuit 10, whereby converging of the transmission voltage to the reference voltage in each slot can be attained more rapidly and accurately.

The embodied transmission power control circuits shown in FIGS. 5, 9 and 11 may be respectively incorporated in a base station of a mobile communication system having also a plurality of mobile stations and using a π/4QPSK modulation and a time-division multiplex access. Since a signal subjected by the π/4QPSK modulation has an amplitude variation, it is necessary to prevent the amplitude factor of the modulated signal from being suppressed or changed by the transmission power control. Therefore, according to the transmission power control circuit of the present invention, it is possible to restrict such suppression or fluctuation occurring when the reference voltage $V_{REF}$ is kept constant.

In addition, in a general time-division multiplex access procedure, a transmission power is required to be adjusted at a predetermined level within the beginning period or power control time period of each frame or slot. By incorporating the transmission power control circuit according to the present invention, it is possible for the level of the transmission power to quickly follow to the predetermined level before the transmission period.

Furthermore, in a general mobile communication system comprising a plurality of mobile stations and at least a base station, distances therebetween are different, and thus the level of transmission power should be varied for respective mobile stations or slots. By using the transmission power control circuit according to the present invention, the level of the transmission power can be set accurately to reduce an error in a service area. In addition, it is capable of avoiding the amplitude modulated signals at a current channel and adjacent channels from interference of the transmission power control.

However, the transmitting power control circuit according to the present invention is not limited to the above exampled constitutions, and its application is not limited to the base station of the mobile communication system using the π/4QPSK modulation and the time-division multiplex access. For example, the amplifier comprises a variable gain amplifier for adjusting the transmission power of the signal, instead of the attenuator. As to applications, the present invention can be applied mobile stations in this system and another system using a frequency-division multiplex access. Moreover, it may be applied to a wire communication system within a network.

In the above embodiments, two kinds of clock frequencies (it is possible for lower one to be zero) are used in order to equivalently change the time constant at two stages, but the present invention is not limited thereto. The time constant may be changed at more than two stages by using three or more kinds of clock frequencies, and may be changed serially. By such configurations, it is possible to better perform control of the transmission power. Further, the higher frequency of clock may be set in accordance with a difference level between the adjacent frame signals.

In addition, when a transmitter in a base station has to transmit signals having different power levels for frames, the time constant may be set and varied in accordance with differences in the transmission power levels.

It is further understood by those skilled in the art that the forgoing description is preferred examples and that various changes and modifications may be made in the invention without departing from the spirit and scope thereof.

What is claimed is:

1. A transmission power control circuit for adjusting a power level of a transmission signal to be output at a predetermined level comprising:

amplitude adjusting means in response to an amplitude control signal for adjusting an amplitude of an input signal to output the amplitude adjusted signal as said transmission signal;

detection means for detecting a DC level of said output signal to generate a detection voltage signal;

reference generating means for variably generating a reference voltage signal;

comparison means for comparing said detection voltage signal with said reference voltage signal to generate a logical signal representing whichever is larger, either the detection or reference voltage signal;

clock generating means for variably generating a clock signal;

amplitude control signal generating means including an up/down counter for up-counting or down-counting pulses of said clock signal in response to said logical signal output from said comparison means, and for generating said amplitude control signal associated with the count value of said up/down counter to said amplitude adjusting means; and control means for controlling said reference generating means to vary the level of said reference voltage signal according to said predetermined level of said transmission signal to be output, and for controlling said clock generating means to generate said clock signal having a high frequency during a transition period of the reference voltage signal and a low frequency during the reference voltage signal being kept substantially constant.

2. A transmission power control circuit as set forth in claim 1, wherein said amplitude adjusting means comprises a variable attenuator, the amount of attenuation being controlled in accordance with said amplitude control signal.

3. A transmission power control circuit as set forth in claim 2, wherein said amplitude adjusting means further comprises an amplifier for amplifying the attenuated signal output from said attenuator.

4. A transmission power control circuit as set forth in claim 1, wherein said low frequency of said clock signal is zero.

5. A transmission power control circuit as set forth in claim 1, wherein said amplitude control signal generating means further comprises a D/A convertor for converting said count value of said up/down counter to an analog value to provide it as said amplitude control signal.

6. A transmission power control circuit as set forth in claim 1, wherein said up/down counter comprises a presettable up/down counter, and said amplitude control signal generating means further comprises a memory storing initial values and for providing one of those corresponding to said transmission signal to said presettable up/down counter under a control of said control means to start the counting from the provided initial value.

7. A transmission power control circuit as set forth in claim 1/wherein said input signal is an amplitude modulated signal.

8. A transmission power control circuit as set forth in claim 1, wherein said reference voltage signal generated from said reference voltage generating means has a reference voltage range including permissible error range, and said comparison means comprises a window comparator to generate an inhibit signal to said up/down counter when said detection voltage signal is within said reference voltage range, so that said up/down counter is inhibited from its count operation.

9. A transmission power control circuit as set forth in claim 1, wherein said input signal comprises a plurality of frame signals to be transmitted by a time-division multiplex transmission, and said control means controls said reference voltage signal generating means to vary said reference voltage signal in accordance with the frame signals.

10. A transmission power control circuit as set forth in claim 9, wherein said circuit is incorporated in a base station of a mobile communication system, which transmits said frame signals to a plurality of mobile stations of said mobile communication system.

11. A transmission power control circuit as set forth in claim 10, wherein the frequency of said clock signal output from said clock generating means during said transition period of said reference voltage signal is set in accordance with a difference level between two adjacent frame signals.

12. A transmission power control circuit as set forth in claim 9, wherein said circuit is incorporated in at least one of a plurality of mobile stations of a mobile communication system, which transmits said frame signals to other mobile stations and a base station of said mobile communication system.

13. A transmission power control circuit as set forth in claim 12, wherein the frequency of said clock signal output from said clock generating means during said transition period of said reference voltage signal is set in accordance with a difference level between two adjacent frame signals.

* * * * *